METHODS OF MAKING PRINTED CIRCUIT COMPONENTS

Filed Nov. 7, 1961

INVENTORS
J. W. BALDE
W. E. DEWEY
H. M. PEPIOT
BY
R. V. Peters
ATTORNEY

3,205,555
METHODS OF MAKING PRINTED CIRCUIT COMPONENTS

John W. Balde, Flemington, William E. Dewey, Ringoes, and Harold M. Pepiot, Princeton, N.J., assignors to Western Electric Company, Incorporated, New York, N.Y., a corporation of New York Filed Nov. 7, 1961, Ser. No. 150,809
7 Claims. (Cl. 29—25.42)

This invention relates to methods of making printed circuit components and more particularly to methods of making thin-film tantalum components and attaching leads thereto.

In the past, printed circuit components have been fabricated for use in microcircuitry by positioning a mask, having apertures corresponding to the configuration of the desired component, on an insulating substrate. The substrate having the mask positioned thereon is then placed in a vacuum evaporating or sputtering chamber and a film-forming metal such as tantalum is deposited through the apertures of the mask onto the substrate.

The use of a mask to provide a desired metallic pattern has many inherent disadvantages, especially when the desired metallic patterns are extremely minute in size or intricate in detail. One of the disadvantages of using a mask, for example, is the fact that accurate masks are very difficult to manufacture and consequently very costly. Also, the mask must be first coated with the particular film-forming metal to be deposited in the vacuum evaporating or sputtering chamber to prevent the metal of the mask from contaminating the deposited metallic pattern. A further disadvantage is the building up of the thick layers of the film-forming metal on the mask after depositing several metallic patterns through the apertures of the mask. Such thick layers of the film-forming metal readily chip off the mask and affect the configuration and electrical characteristics of the metallic pattern deposited through the apertures of the mask. Moreover, the masks necessary to produce minute or intricate patterns tend to be fragile and exceedingly difficult to handle, and sometimes require elaborate and expensive devices to locate and hold them on the substrate. For these reasons, chemical etching techniques are often preferred for the production of intricate or highly detailed metallic patterns on a substrate.

A distinct disadvantage of the conventional chemical etching techniques is the necessity of first protecting the insulating substrate from the deleterious effects of etching materials. Such protection is especially important if a glass or ceramic substrate is used in conjunction with an etching material containing hydrofluoric acid which violently attacks glass or ceramic materials and causes undercutting of the metallic pattern thereon. It is important to protect the substrate from such undercutting because when subsequent metals are deposited on the substrate, this undercutting is likely to cause the formation of a weak point in the electrical continuity of the metallic pattern.

To so protect the substrate, one of the suggested methods, described in co-pending application, Serial No. 94,543, filed March 9, 1961 by D. A. McLean and D. S. Nicodemus assignors to the Bell Telephone Laboratories, Incorporated, is to first deposit a film-forming metal upon the substrate and anodize such metal to produce a thin and impervious film of oxide on the substrate. Then, the film-forming metal, a portion of which constitutes the ultimate component, is deposited on such oxide layer and this metal film is selectively etched to obtain a predetermined metallic pattern of desired electrical characteristics.

If, in the fabrication of printed circuit components using chemical etching techniques, the underlying film-forming metal oxide for protecting the substrate is eliminated, and, at the same time, undesirable undercutting of the film-forming metal on the substrate is also eliminated, the fabrication of printed circuit components is considerably more economical. This is because the substrate need only be passed once through a film-forming metal depositing chamber for applying to the substrate the metal constituting the ultimate desired component, and the substrate need not be passed through such depositing chamber merely for protection of the substrate.

It is accordingly an object of this invention to provide novel methods of making printed circuit components.

Another object of the invention is the provision of methods of making printed circuit components using chemical etching techniques wherein the deleterious effects of undercutting the substrates are eliminated without the application of protective coatings to the substrates prior to the deposition of the film-forming metals constituting the ultimate components.

A further object of this invention is to provide novel methods of forming thin-film tantalum components on glass substrates and attaching leads thereto.

Methods illustrating certain features of the invention may include the steps of successively applying gold to the surface area of an insulating substrate on which no component is desired, depositing a layer of a film-forming metal not subject to attack by aqua regia on the surface area of the substrate including those portions having the gold applied thereon, and then immersing the substrate having the gold and film-forming metal thereon in a bath of aqua regia to remove the gold and portions of the film-forming metal deposited on the gold. If it is desired to attach leads to the film-forming metal, such method may also include masking a resist on portions of the tantalum and gold where the leads are to be attached prior to the immersing of the substrate into the bath of aqua regia to prevent the etching away of that portion of the tantalum and gold protected by the resist. After the resist is removed from the tantalum film, a lead may be readily bonded to that portion of the tantalum film overlying the gold or to the gold film itself.

A more complete understanding of the invention may be obtained from the following detailed description of a method forming a specific embodiment of the invention, when read in conjunction with the appended drawings, wherein.

Figure 6:
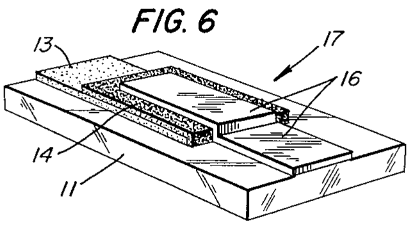
FIG. 6 is a perspective view of a capacitor made in accordance with the principles of the present invention.
Figures 9, 10:
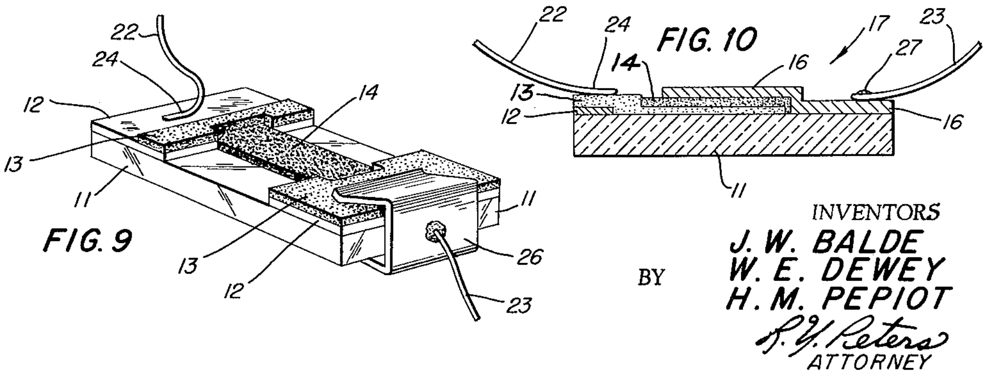

FIG. 9 is a perspective view of a completed printed circuit component which may be used as an electrical conductor or resistor and shows a lead attached to a terminal portion of the film-forming metal having an underlying gold film and further shows another lead attached to a terminal portion of the gold film; and FIG. 10 is a cross-sectional view of the capacitor of FIG. 6 and shows a gold film underlying a portion of the tantalum to which a lead is attached and shows a counter electrode of gold to which another lead is attached.

Although metal films formed on substrates in accordance with the present invention are essentially two dimensional, they have been illustrated in the drawing as three dimensional to illustrate more clearly the method steps of the invention. Also, the relative dimensions in the drawing have often been distorted to illustrate the invention more clearly.

Figure 1:
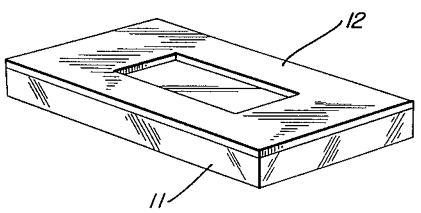
FIG. 1 is a perspective view of a gold film applied on those portions of the surface area of an insulating substrate either where no component or where a lead connection is ultimately desired.

Referring now to FIG. 1, there is shown an insulating substrate 11 upon which various printed circuit components are to be formed in accordance with the present invention. The material of which substrate 11 is composed must be such so as to conform to the requirements imposed by the various steps of the present method of making printed circuit components. In general the substrates set forth in co-pending application, Serial No. 94,543, filed March 9, 1961 by D. A. McLean and D. S. Nicodemus, assignors to the Bell Telephone Laboratories, Incorporated, and R. W. Berry Patent 2,993,266 are suitable for use in practicing the present invention. More particularly, the substrate must have a smooth surface which is completely free from sharp changes in contour in order to obtain the optimum quality of metal deposit. Also the substrate should be able to withstand temperatures as high as 300° C. to 400° C., since the substrate may be heated to temperatures in this range during the deposition.

The requirements of an anodizing step place additional limitations on the choice of a substrate material. Ideally, the substrate should have a high electrical resistance, as for example, glass or ceramic. This limitation arises from the fact that a current must flow through the surface which is to be anodized to produce an oxide layer. During the initial period of an anodizing process a thin film of dielectric oxide begins to form at the surface. If the substrate material has a substantially higher conductivity than this oxide film, the current previously flowing through the surface to be anodized will take the easier path through the substrate thereby effectively ending the anodization. Accordingly, a suitable substrate should have an electrical resistance at least comparable to the dielectric oxide. Thus, most all types of refractory material such as glass and ceramics are suitable substrates from a temperature and resistance standpoint.

As a preliminary step of the method in accordance with this invention, the substrate 11, FIG. 1, is first rigorously cleaned. Conventional cleaning agents are suitable, the choice of a particular one being dependent upon the composition of the substrate itself. For example, where the substrate is glass or a glazed ceramic, a convenient cleaning method is first de-greasing the substrate with a vapor, such as trichlorethylene or the like, and then scrubbing the substrate with a hot (about 80° C.) solution of a detergent, such as Igepal which is a United States trademark registered by the General Dyestaff Corporation of New York City and comprises a group of alkylphenolethylene oxide condensation products, or a similar detergent. Next, the substrate is rinsed in ordinary tap water and dried.

After the substrate is cleaned and dried, gold is selectively applied to all portions of the surface area of the insulating substrate 11 except those portions where the ultimate printed circuit component is desired. A gold film 12, FIG. 1, usually having a thickness in the range of about 1,000 up to about 50,000 angstroms, results from such application. This application of gold to the substrate may be accomplished by any of the well-known methods of the prior art for obtaining gold films on insulating substrates. For example, a gold-containing composition capable of being decomposed by heat into elemental gold and organic materials may be applied to the substrate by brushing, spraying, silk screening, or the like. The substrate may then be fired to decompose the gold-containing composition, to drive-off the organic materials and to form a substantially continuous metallic gold film on the substrate without substantial diffusion of the gold into the substrate. The use of such a gold-containing composition to obtain a gold film on a substrate is disclosed in detail in copending application, Serial No. 121,236, filed on June 30, 1961 by W. R. McCormack, assignor to the Western Electric Company, Incorporated.

Following the application of the gold film 12 to the insulating substrate 11, the substrate with the gold film thereon is cleaned thoroughly by conventional methods for the deposition of a film-forming metal. A cleaning sequence that has been successfully used includes vapor de-greasing in trichlorethylene and acetone followed by washing in a detergent such as "Igepal," and rinsing in water and hot hydrogen peroxide at a temperature of about 60° to 80° C. Other sequencies include the use of hot chromic acid, nitric acid, or other contamination removing agents.

Figure 2:
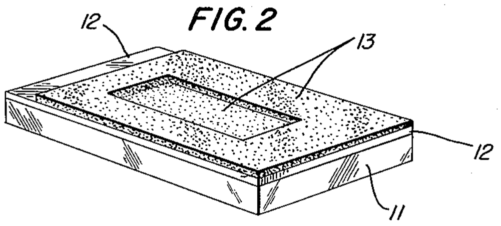
FIG. 2 is a perspective view of the substrate of FIG. 1 with a film-forming metal deposited over the gold film.

As the next step in a method according to the present invention a film-forming metal not subject to attack by aqua regia and preferably capable of being anodized is deposited upon the gold film 12 except for a terminal portion thereof and upon that portion of substrate 11 which is not covered by the film 12, thereby forming a layer 13, FIG. 2. Advantageously, such metal may be selected from the group consisting of zirconium, tantalum, titanium and niobium.

The deposition may be accomplished by a condensation method, such as vacuum evaporation, or by cathodic sputtering. See "Vacuum Deposition of Thin Films," L. Holland, J. Wiley & Sons, Inc., 1956 and R. W. Berry Patent 2,993,266. In general, the thickness of the deposited layer depends on the particular circuit desired. However, it has been determined that the prefered minimum thickness is approximately 100 angstroms regardless of the particular film-forming metal being used. As an upper range for the maximum limit, 5,000 angstroms is generally used.

If merely a conductive circuit element is desired and no provision for connecting leads to such conductive element is desired, the substrate 11 having the gold film 12 and the film-forming metal layer 13, FIG. 2, thereon is immersed in a bath of aqua regia. The aqua regia diffuses through the layer 13, which is thin and microporous, and comes into contact with the gold film 12. Since the equa regia attacks only gold, the gold film 12 is etched away. After the gold film 12 is etched away, the layer 13 overlying the gold film 12 is unsupported and breaks away from the remaining layer 13. Such removal may be speeded up by heating the bath of aqua regia to a temperature of from about 60° C. to about 80° C., and ultrasonically agitating the bath of aqua regia. Typically, the power density of the ultrasonic agitation is in the range of about 1/20 to about 1/5 watts per cubic inch of aqua regia at a frequency in the range of about 20,000 to about 40,000 kc.

Figure 3:
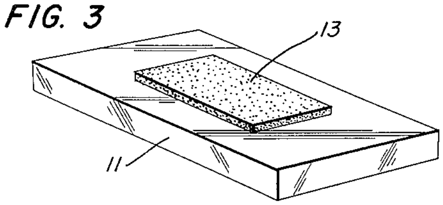
FIG. 3 is a perspective view of the substrate shown in FIG. 2 after immersion in a bath of aqua regia.

The removal of the gold film 12 and that portion of the film-forming metal layer 13 which overlies such gold film 12 leaves a predetermined conductive metallic pattern of desired electrical characteristics on the substrate 11, as shown in FIG. 3. If the layer 13 is to be used as a conductor, it is usually deposited in a relatively thick film (about 5,000 angstroms) and therefore requires no anodization. However, if the layer 13 is relatively thin, anodization may be desirable for stability, as explained below.

Figure 5:
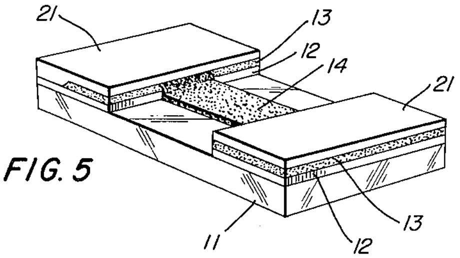
FIG. 5 is a perspective view of the substrate of FIG. 4 after immersion in a bath of aqua regia and after anodization.

If the film-forming metal layer 13 deposited on the substrate 11 is desired to be used in an electrical circuit as a resistor or a capacitor, such layer 13 is anodized to produce a metal oxide layer 14, FIG. 5. For example, if a resistor is desired, the layer 13 is anodized to vary the thickness of such layer 13 to thereby control the resistance thereof. On the other hand, if a capacitor is desired, the layer 13 is anodized to produce the metal oxide layer 14 which acts as a dielectric.

The anodization may be accomplished by any of the well-known anodizing methods of the prior art. The usual procedure is similar to conventional anodizing processes in which a low voltage is initially applied. Typically, this low voltage may be in the order of about 20 up to about 45 volts. After this low voltage anodization, the metal oxide layer 14 formed thereby is "aged" by placing the substrate in an oven, heating it to a temperature of about 250° C. for a period of from about 16 hours to about 18 hours. Although various types of atmospheres may be used in such oven, in the usual case normal atmosphere has proved quite satisfactory. After such aging, the metal oxide layer 14 is again anodized, by gradually increasing the voltage to thereby obtain the desired ratio of oxide thickness to film-forming metal thickness. Of course, such ratio is determined by the particular electrical characteristics desired in the ultimate component. Typically, the voltage is increased to a range of about 40 up to about 200 volts. In general, the low voltage anodization and the aging, prior to the high voltage anodization, tend to make the metallic layer more stable. More particularly, such procedure tends to prevent further anodization or oxidation of the oxide layer by atmospheric conditions such as humidity and heat. The anodizing procedure is described in detail in R. W. Berry Patent 2,993,266.

For the anodization of film-forming metals in accordance with this invention low conductivity electrolytes have been found to be very satisfactory. Examples of preferred electrolytes are aqueous solutions of oxalic acid, citric acid, tartaric acid and phosphoric acid.

In the event that the ultimate printed circuit component is to be a capacitor 17, FIG. 6, a counter electrode 16 must be deposited over the metal oxide layer 14 which acts as a dielectric. Any suitable method for producing an electrically conductive layer on the surface of a metal oxide layer is satisfactory, provided such method does not mechanically or thermally disturb the oxide layer. As disclosed in the R. W. Berry Patent 2,993,266, vacuum evaporation has been found to be especially suitable for producing counter electrodes in accordance with this invention. Metal, such as aluminum and gold, may be used conveniently in conjunction with vacuum evaporation to produce such counter electrodes. In evaporating the counter electrode 16 upon the dielectric layer 14 and upon a terminal portion of the substrate 11, such counter electrode may be conveniently restricted by a mechanical mask or an applied patterned coating so as to only deposit the counter electrode on predetermined portions of layer 14 and substrate 11. Prior to the deposition of the counter electrode, it may be desirable to clean the substrate in the same manner that the substrate was cleaned for the deposition of the film-forming metal. The capacitor 17 produced in accordance with the present invention is shown in FIGS. 6 and 7.

Figure 7:
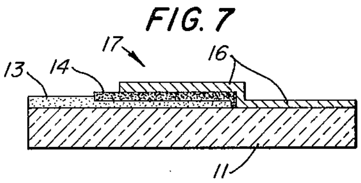
FIG. 7 is a cross-sectional view of the capacitor of FIG. 6.
Figure 8:
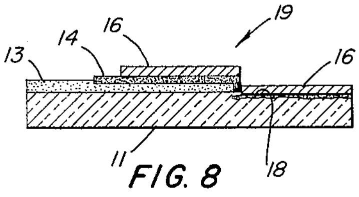
FIG. 8 is a cross-sectional view of a capacitor formed on a substrate by a method of the prior art, a portion of which is undercut.

As is apparent from FIG. 7, there is no undercutting of the substrate 11 and the counter electrode 16 is therefore continuous. Thus, one of the more obvious advantages of the present method of making printed circuit components using chemical etching techniques is the fact that there is no undercutting of the substrate 11 and the counter electrode 16 is continuous. On the other hand, a capacitor 19, FIG. 8, fabricated by prior art etching techniques, has a discontinuous counter electrode 16 due to the undercutting, as shown at 18 in FIG. 8. Obviously, if an external circuit is connected to the counter electrode 16 and to the layer 13 of film-forming metal, this circuit will detect either no capacitance or an erratic capacitance due to the lack of satisfactory continuity of the counter electrode 16. As was previously mentioned, one of the prior art of methods of preventing such undercutting 18 is to protect initially the substrate 11 from chemical etching materials by coating such substrate 11 with a layer of an oxide of a film-forming metal (see the aforementioned co-pending application, Serial No. 94,543). However, such protection of the substrate is very costly since: (1) the substrate must be passed through the evaporating or sputtering chamber an extra time; (2) the film-forming metal must be oxidized an extra time; and (3) the substrate must be cleaned and handled additionally. On the other hand, the method of the present invention eliminates the necessity of protecting the substrate and at the same time eliminates undercutting of such substrate.

Figure 4:
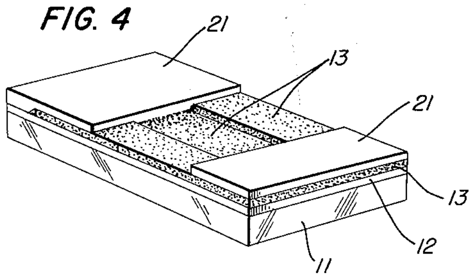
FIG. 4 is a perspective view of the substrate of FIG. 2 having an acid resist applied on those portions of the film-forming metal which are to be protected from anodization and applied on those portion upon which it is desired to connect leads.

It has been determined that if a gold film is applied to the substrate before the film-forming metal is deposited thereon, it is much easier to attach electrical elements, such as leads, to the gold film by soldering, welding, brazing, or the like, to thereby make electrical connections to the film-forming metal comprising the printed circuit component. In addition, if a gold film underlies the film-forming metal, it is much easier to attach electrical elements to the film-forming metal by clips or ultrasonic bonding techniques. Furthermore, the junction of the gold film and film-forming metal have highly satisfactory conductivity. Accordingly, to prevent the exposed gold film 12, FIG. 2, and the film 12 underlying that portion of the film-forming metal layer 13 to which it is desired to attach a lead from being etched away by the aqua regia, an acid resist 21 is selectively applied to such exposed gold film 12 and such portion of the film-forming metal layer 13, as shown in FIG. 4. The acid resist 21 is applied by silk screening, rubber stamping, spraying, or the like, immediately after the film-forming-metal-deposition step and just prior to the aqua-regia-immersion step. Wax, epoxy resin, grease, lacquer, or the like, are suitable resists.

After the resist 21 is selectively applied, the substrate 11 having the gold film 12, the layer 13 and the resist 21 thereon is immersed in the bath of aqua regia as previously described. The aqua regia does not attack the resist 21. It diffuses through the layer 13 not protected by the resist 21 and etches away the gold film 12 underlying the unprotected layer 13, causing the overlying layer 13 to break away, as shown in FIG. 5.

If the film-forming metal is to be used in an electrical circuit merely as an electrical conductor, it is usually deposited in a relatively thick layer (about 5000 angstroms), and therefore requires no anodization. Hence, the resist 21 is removed from the layer 13 by any of the prior art methods for removing an acid resist. For example, the substrate 11 may be immersed in a solvent, such as toluene, acetone, carbon tetrachloride, which dissolves the resist 21 to remove it from the layer 13. Alternatively, a blast of steam may be directed on the resist 21 to remove it. After the resist 21 has been removed, leads 22 and 23 may then be soldered, ultrasonically bonded, welded, or brazed to the gold film 12 and that portion of the layer 13 having the underlying gold film 12.

On the other hand, if it is desired to use the film-forming metal layer 13 in an electrical circuit as a resistor or a capacitor, such layer 13 is, as previously explained, anodized to produce the oxide layer 14. It is particularly advantageous to use the same resist 21, which is used to protect the terminal portion of the gold film 12 and layer 13, to isolate such terminal portions from the anodizing electrolyte to prevent current leakage through the gold film 12. Thus, in the fabrication of printed circuit resistors and capacitors the resist 21 serves two purposes: (1) it prevents terminal portions of the gold film 12 and layer 13 from being removed by the aqua regia; and (2) it prevents current leakage to the gold film during anodization.

Prior to the anodization the microscopic edge portions of the gold film 12 may need to be first covered with an insulating material to prevent current leakage through such edge portions during anodization. Conveniently, the edges of the gold film 12 may be covered by heating the acid resist 21, which protects terminal portions of the gold film 12 and film-forming metal layer 13 from being etched away, to flow such resist 21 over the microscopic edges so that they will no longer be exposed.

Another method of covering the exposed gold edges is by applying another layer of resist 21 over a slightly larger area.

If it is desired to produce a printed circuit resistor having leads 22 and 23 connected thereto, all that is necessary is to anodize the film-forming metal layer 13 prior to the removal of the acid resist 21, and then remove the resist 21. Next, the leads 22 and 23 are attached to terminal portions of the gold film 12 and the layer 13.

On the other hand, if it is desired to produce a printed circuit capacitor having leads 22 and 23 attached thereto, the film-forming metal layer 13 is anodized to produce a capacitor dielectric before the acid resist 21 is removed. Then, the acid resist 21 is removed and a counter electrode 16 is deposited over the oxide layer 14, as described above. Next, the leads 22 and 23 are connected to the gold counter electrode 16 and the terminal portion of the layer 13 overlying the gold film 12.

One particularly advantageous method of attaching the lead 22 to the gold film 12, FIG. 9, is by the use of ultrasonic bonding techniques as disclosed in co-pending application, Serial No. 135,051, filed on August 30, 1961 by A. J. Avila, S. J. Buzash and R. E. Thomas (now U.S. Patent 3,128,649). A bond 24 formed by such ultrasonic bonding techniques is shown in FIG. 9. The bond 24 is also shown in FIG. 10 for connecting the lead 22 to a terminal portion of the film-forming metal layer 13 of the capacitor 17.

A convenient method of attaching the lead 23 to the terminal portion of the film-forming metal layer 13 having an underlying gold film 12 is by first fixing lead 23 to a spring clip 26, FIG. 9, and then slipping the clip 26 over the edge of the substrate 11 so that the clip forcefully contacts the layer 13.

Another method of attaching the lead 23 to the gold counter electrode 16 is a conventional method of soldering which includes heating the lead 23 in the vicinity of the terminal portion of the counter electrode 16 and permitting the lead 23 to transmit soldering heat to a small quantity of solder and the terminal portion of the counter electrode 16 . A solder bond 27 formed in this manner is shown in FIG. 10.

FIGS. 3 and 9 illustrate articles produced in accordance with the above-described method. More particularly, FIG. 3 illustrates the conductive film-forming metal layer 13 formed on the insulating substrate 11. The layer 13 may be used to interconnect various printed circuit components. FIG. 9 illustrates a resistor having leads 22 and 23 attached by ultrasonic bonding and clipping, respectively, to terminal portions of the gold film 12 and the layer 13.

FIGS. 6, 7 and 10 illustrate a capacitor produced in accordance with the above method. More particularly, FIG. 10 shows a capacitor 17 having leads 22 and 23 ultrasonically bonded and soldered thereto, respectively, in accordance with the above described method of making printed circuit capacitors and attaching leads thereto.

Several examples of methods in accordance with the present invention are described in detail below. These examples are included merely to aid in the understanding of the invention and variations may be made by one skilled in the art without departing from the spirit and scope of this invention. Listed below are three examples directed to the practice of the present invention:

*Example 1*

This example describes the production of a resistor of this invention.

A glass microscope slide (1.5 inches long x 0.5 inch wide x 0.060 inch thick) was used as the substrate. The substrate was scrubbed in a hot (about 80° C.) solution of the detergent "Igepal," then rinsed in tap water, and flame dried to produce a clean surface.

After the substrate was cleaned, a gold-containing composition in the form of a paste capable of being decomposed by heat into elemental gold and organic materials was selectively applied to the substrate. This application was affected by silk screening the paste on the top surface of the substrate except on a rectangular area 1.2 inches long x 0.020 inch wide, which defined the ultimate component area. This rectangular area was located in the middle of a substrate such that the longer dimension of the area was parallel to the longer side of the substrate (as shown in FIG. 1). Then, the substrate was fired at a temperature of about 535° C. for about two hours to produce a gold film approximately 4,000 angstroms thick.

Next, the substrate having the gold film thereon was subjected to a cleaning sequence for sputtering. This sequence included successively vapor de-greasing with trichlorethylene, agitating the substrate in a solution of the detergent "Igepal," and then rinsing with tap water and with deionized water. After the rinsing with the deionized water, the substrate was immersed for ten minutes in boiling hydrogen peroxide and then rinsed again in deionized water. The substrate was then dried in hot dried nitrogen.

Sputtering was accomplished by passing the substrate through a vacuum chamber having an argon atmosphere of about 20 microns of mercury. While within the vacuum chamber the substrate was heated to about 300° C. The substrate was left in the chamber until a film of tantalum having a thickness of about 400 to 500 angstroms was deposited over the entire surface of the substrate which had the gold film previously applied thereto except for a terminal portion of the gold (as shown in FIG. 2).

Next, a solution of aqua regia was heated to a temperature of about 80° C. and agitated with about 1/10 watt of ultrasonic energy per cubic inch of aqua regia at a frequency of 30,000 c.p.s. Then, the substrate having the gold and tantalum films thereon was immersed in the aqua regia and left therein until the entire gold film and tantalum film deposited on such gold film were removed. However, that portion of the tantalum film (FIG. 3) having no underlying gold film was unaffected by the aqua regia, and such tantalum film had a resistance of about 1500 ohms.

*Example 2*

This example describes the production of a resistor and attaching leads thereto.

A glass microscope slide having the same dimensions as the slide of Example 1 was cleaned in the same manner described in Example 1 and used as the substrate.

A gold film approximately 4,000 angstroms thick was formed on the top surface of the substrate except on a rectangular area 1.2 inches long x 0.020 inch wide, which defined the ultimate component area (as shown in FIG. 1). Such gold film was formed in the same manner as described in Example 1.

Then the glass slide was cleaned for sputtering, and tantalum was sputtered to a thickness of about 400 to 500 angstroms (FIG. 2), as described in Example 1.

Then, using a heated metal screen, molten wax (80° to 90° C.) was silk screened about one-quarter of an inch from the smaller rectangular sides of the slide (as shown in FIG. 4) to a thickness of about three mils. The molten wax was then allowed to solidify. This solidified wax serves as an acid resist.

A solution of aqua regia was heated to a temperature of about 30° C. and agitated with about one tenth watt of ultrasonic energy per cubic inch of aqua regia at a frequency of 30,000 c.p.s. The substrate having the gold and tantalum films and the wax resist thereon was then immersed in the aqua regia and left therein until the entire gold film not protected by the resist and tantalum film deposited on such unprotected gold film were removed. That portion of the tantalum film having no underlying gold film was unaffected by the aqua regia.

Next, the tantalum film was anodized with 30 volts using 3% tartaric acid as the electrolyte (as shown in FIG. 5). The voltages were then increased and the anodization continued until the resistor acquired a resistance of 5,000 ohms±one percent.

The substrate was immersed in toluene to dissolve and thereby remove the resist. Spring clips having leads attached thereto were then connected to the ends of the tantalum resistance pattern to enable the thin film tantalum film resistor to be connected to external circuitry.

*Example 3*

This example describes the production of a capacitor and attaching leads thereto.

A glass microscope slide having the same dimensions as the slide of Example 1 was cleaned in the same manner described in Example 1 and used as the substrate. A gold film approximately 4,000 angstroms thick was formed on the entire top surface of the substrate except on a rectangular area (1 inch long x 0.06 inch wide) which defined the ultimate component area (as shown in FIG. 1). This gold film was formed in the same manner as described in Example 1.

Then the glass slide was cleaned for sputtering and tantalum was sputtered to a thickness of about 2,000 angstroms (FIG. 2) as described in Example 1. Molten wax was silk screened about one-quarter of an inch from the smaller rectangular sides of the substrate (as shown in FIG. 4) to a thickness of about three mils.

The substrate having the gold and tantalum films and the wax resist thereon was then immersed in aqua regia and then left therein until the gold film not protected by the resist and the tantalum film deposited on such unprotected gold film were removed (FIG. 5). Removal was accomplished as described in Example 2.

Next, the tantalum film was anodized by starting with zero volts and gradually increasing the voltage at a rate of 30 volts per minute until 130 volts was reached. Then, the tantalum film was anodized with the 130 volts for ten minutes, thereby forming the oxide dielectric (FIG. 5). A three percent tartaric acid was used as the electrolyte.

After anodization, the substrate was immersed in toluene to dissolve and thereby remove the resist.

Then the substrate was cleaned for gold evaporation in the same manner that the substrate was previously cleaned for tantalum sputtering as described in Example 1.

Gold was then evaporated over the oxide tantalum area and a terminal portion of the substrate (as shown in FIG. 6) to a thickness of approximately 4,000 angstroms. During the evaporation process a mechanical mask was used to restrict the gold counter electrode to a width of 0.04 inch and a length of 1.05 inches.

Next, a lead was ultrasonically bonded to the terminal portion of the tantalum film overlying the gold film and another lead was soldered to the gold counter electrode (as shown in FIG. 10).

The above-described procedure produced an effective capacitive area 0.04 inch wide x 0.8 inch long with a nominal capacitance of 0.02 microfarad.

What is claimed is:

1. A method of making thin-film circuit components, which comprises the steps of:
   successively applying gold to those surfaces of an insulating substrate on which no component is desired;
   depositing a layer of a film-forming metal selected from the group consisting of zirconium, tantalum, titanium, and niobium on exposed areas of the substrate and on the gold film; and
   immersing the substrate having the gold and film-forming metal thereon in a bath of aqua regia acid, causing the acid to diffuse through the film-forming metal, to attack the gold underlying said film-forming metal and to remove said gold and the overlying film-forming metal.

2. The method of claim 1 wherein the film-forming metal is tantalum.

3. The method of making thin-film circuit components and attaching leads thereto which comprises the steps of:
   successively applying a gold film to those surface areas of a glass substrate on which no component is desired;
   depositing a thin layer of a film-forming metal selected from the group consisting of zirconium, tantalum, titanium, and niobium on exposed areas of the substrate and the gold film;
   masking with a resist those areas of the film-forming metal on which a lead is to be attached;
   immersing the substrate having the gold, film-forming metal and resist thereon in a bath of aqua regia acid, causing the acid to diffuse through the film-forming metal not protected by the resist, to attack the gold underlying said film-forming metal and to remove said gold and the overlying film-forming metal;
   removing the resist from the film-forming metal; and
   attaching a lead to the film-forming metal overlying said gold film.

4. The method of making a thin-film capacitor which comprises the steps of:
   successively applying a gold film to those surface areas of a glass substrate on which no component is desired;
   depositing a thin film of tantalum on the exposed area of the glass substrate and on the gold film;
   immersing the substrate having the gold and tantalum thereon in a bath of aqua regia acid, causing the acid to diffuse through the tantalum, to attack the gold underlying said tantalum and to remove said gold and the overlying tantalum;
   anodizing said tantalum film to form an oxide dielectric film; and
   depositing a counter electrode over said oxide dielectric film.

5. The method of making a thin-film capacitor and attaching leads thereto, which comprises the steps of:
   successively applying a gold film to those surface areas of a glass substrate on which no capacitor is desired;
   depositing a thin film of tantalum on the exposed areas of the substrate and on the gold film;
   masking with a resist those areas of the tantalum on which a lead is to be attached;
   immersing the substrate having the gold film, tantalum film and resist thereon in a bath of aqua regia acid, causing the acid to diffuse through the tantalum not protected by the resist, to attack the gold underlying said tantalum and to remove said gold and the overlying tantalum;
   selectively anodizing said exposed tantalum film to form an oxide dielectric thereon;
   removing the resist from the tantalum film under which some gold remains;
   depositing a gold counter electrode over said oxide dielectric film;
   attaching a first lead to the tantalum film under which some gold remains; and
   attaching a second lead to the gold counter electrode.

6. A method according to claim 5 comprising the steps of:
   heating the bath of aqua regia acid to a temperature of from about 30° C. to about 80° C.,
   ultrasonically agitating the bath of aqua regia acid, and
   heating the resist prior to anodization to cause said resist to flow over the edges of the gold film to prevent current leakage during the anodization.

7. The method of making a thin film resistor, which comprises the steps of successively applying a gold film to the surface area of a glass substrate on which no component is desired, depositing a thin film of tantalum on the surface area of the glass substrate including those portions having the gold film applied thereon, immersing the substrate having the gold and tantalum thereon in a bath of aqua regia to selectively remove said gold and portions of said tantalum deposited on said gold and, anodizing said tantalum film until said tantalum film has a predetermined desired resistance, thereby forming a resistor.

References Cited by the Examiner

UNITED STATES PATENTS

| | | | |
|---|---|---|---|
| 2,281,843 | 5/42 | Jira | 29—155.71 |
| 2,395,442 | 2/46 | Ballard | 29—25.42 |
| 2,693,023 | 11/54 | Kerridge et al. | 29—155.7 |
| 2,728,693 | 12/55 | Cado | 117—212 |
| 2,981,611 | 4/61 | Ashworth. | |
| 2,993,266 | 7/61 | Berry | 29—25.42 |

RICHARD H. EANES, Jr., *Primary Examiner.*

LEON PEAR, *Examiner.*